United States Patent
Laven et al.

(10) Patent No.: US 9,496,351 B2
(45) Date of Patent: Nov. 15, 2016

(54) SEMICONDUCTOR CHIP ARRANGEMENT

(71) Applicant: Infineon Technologies AG, Neubiberg (DE)

(72) Inventors: Johannes Laven, Taufkirchen (DE); Hans-Joachim Schulze, Taufkirchen (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 14/987,818

(22) Filed: Jan. 5, 2016

(65) Prior Publication Data
US 2016/0118466 A1 Apr. 28, 2016

Related U.S. Application Data

(62) Division of application No. 13/659,956, filed on Oct. 25, 2012, now Pat. No. 9,263,271.

(51) Int. Cl.
| | |
|---|---|
| *H01L 21/02* | (2006.01) |
| *H01L 29/32* | (2006.01) |
| *H01L 21/265* | (2006.01) |
| *H01L 21/322* | (2006.01) |
| *H01L 29/66* | (2006.01) |
| *H01L 29/78* | (2006.01) |
| *H01L 29/739* | (2006.01) |
| *H01L 23/26* | (2006.01) |
| *H01L 23/528* | (2006.01) |
| *H01L 23/532* | (2006.01) |
| *H01L 29/36* | (2006.01) |
| *H01L 29/45* | (2006.01) |
| *H01L 29/08* | (2006.01) |
| *H01L 29/861* | (2006.01) |
| *H01L 29/872* | (2006.01) |

(52) U.S. Cl.
CPC ......... *H01L 29/32* (2013.01); *H01L 21/26506* (2013.01); *H01L 21/3221* (2013.01); *H01L 23/26* (2013.01); *H01L 23/528* (2013.01); *H01L 23/53214* (2013.01); *H01L 23/53228* (2013.01); *H01L 29/36* (2013.01); *H01L 29/66333* (2013.01); *H01L 29/66712* (2013.01); *H01L 29/7395* (2013.01); *H01L 29/7802* (2013.01); *H01L 29/0878* (2013.01); *H01L 29/456* (2013.01); *H01L 29/861* (2013.01); *H01L 29/872* (2013.01)

(58) Field of Classification Search
CPC .................. H01L 21/3242; H01L 21/26506; H01L 21/3221; H01L 29/32; H01L 29/36
See application file for complete search history.

(56) References Cited

U.S. PATENT DOCUMENTS

| | | | | |
|---|---|---|---|---|
| 2003/0057522 A1* | 3/2003 | Francis | ............... | H01L 21/221 257/566 |
| 2006/0035436 A1* | 2/2006 | Schulze | ............... | H01L 21/223 438/345 |
| 2012/0074553 A1* | 3/2012 | Hosseini | ............... | H01L 24/03 257/677 |

* cited by examiner

*Primary Examiner* — Bradley K Smith

(57) ABSTRACT

A method for processing a semiconductor carrier is provided, the method including: providing a semiconductor carrier including a doped substrate region and a device region disposed over a first side of the doped substrate region, the device region including at least part of one or more electrical devices; and implanting ions into the doped substrate region to form a gettering region in the doped substrate region of the semiconductor carrier.

17 Claims, 13 Drawing Sheets

FIG 1A

~ 100 providing a semiconductor carrier including a doped substrate region and a device region disposed over a first side of the doped substrate region, the device region including at least part of one or more electrical devices ~ 110 implanting ions into the doped substrate region to form a gettering region in the doped substrate region of the semiconductor carrier ~ 120

FIG 1B

~ 150 providing a semiconductor carrier including a doped substrate region and a device region disposed over a first side of the doped substrate region, the device region including at least part of one or more electrical devices ~ 160 introducing hydrogen ions into the doped substrate region to form a gettering region in the doped substrate region of the semiconductor carrier ~ 170

FIG 2 ~ 200 providing a semiconductor wafer including a doped substrate region disposed between a front side and a back side of the semiconductor wafer, the semiconductor wafer further including one or more electrical devices formed at the front side of the semiconductor wafer ~ 210 subsequently introducing hydrogen ions into the doped substrate region from the back side of the semiconductor wafer to form a gettering region in the doped substrate region ~ 220

SEMICONDUCTOR CHIP ARRANGEMENT

RELATED APPLICATION

This application is a divisional of U.S. patent application Ser. No. 13/659,956, entitled "METHOD FOR PROCESSING A SEMICONDUCTOR CARRIER, A SEMICONDUCTOR CHIP ARRANGEMENT AND A METHOD FOR MANUFACTURING A SEMICONDUCTOR DEVICE", filed on Oct. 25, 2012, which is incorporated herein by reference in its entirety.

TECHNICAL FIELD

Various embodiments relate generally to a method for processing a semiconductor carrier, a semiconductor chip arrangement and a method for manufacturing a semiconductor device.

BACKGROUND

Semiconductor wafers and/or devices are traditionally cleaned to prevent as much as possible contamination by foreign particles. Wafer cleaning methods however have their limits, and may not stop diffusion of contaminants into the wafer. For example, contaminant foreign atoms, e.g. foreign contaminant metals, may diffuse, from a wafer front side and/or wafer back side into the wafer. These foreign atoms may be from solder layers formed over the back side of the wafer or back side metallization layers or even direct copper bonding substrates which may be contacted with the semiconductor back side. Foreign atoms from the front side may come from front side metallization layers, e.g. wafer front side interconnects.

Semiconductors, e.g. silicon wafers, during their manufacture, e.g. by Czochralski growth, may incorporate an intrinsic gettering region, rich in oxygen precipitates. Furthermore, alternatively or in addition to wafer cleaning and/or intrinsic gettering, an extrinsic gettering region may be formed. For example, a polysilicon layer may be applied over the wafer back side. Polysilicon may serve as a gettering site for undesired heavy metals.

The polysilicon layer may however be prone to oxidation, for example, at least partial oxidation during processing of the wafer, e.g. during front end processing of the wafer, and before thinning the wafer. Furthermore, the polysilicon layer may traditionally be completely removed during the wafer thinning processing. In addition, for large diameter wafers it may be difficult to obtain suitable polysilicon layers from basic material suppliers.

SUMMARY

Various embodiments provide a method for processing a semiconductor carrier, the method including: providing a semiconductor carrier including a doped substrate region and a device region disposed over a first side of the doped substrate region, the device region including at least part of one or more electrical devices; and implanting ions into the doped substrate region to form a gettering region in the doped substrate region of the semiconductor carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows a method for processing a semiconductor carrier according to an embodiment;

FIG. 1B shows a method for processing a semiconductor carrier according to an embodiment;

FIG. 2 shows a method for manufacturing a semiconductor device according to an embodiment;

DETAILED DESCRIPTION

Figure 3A:
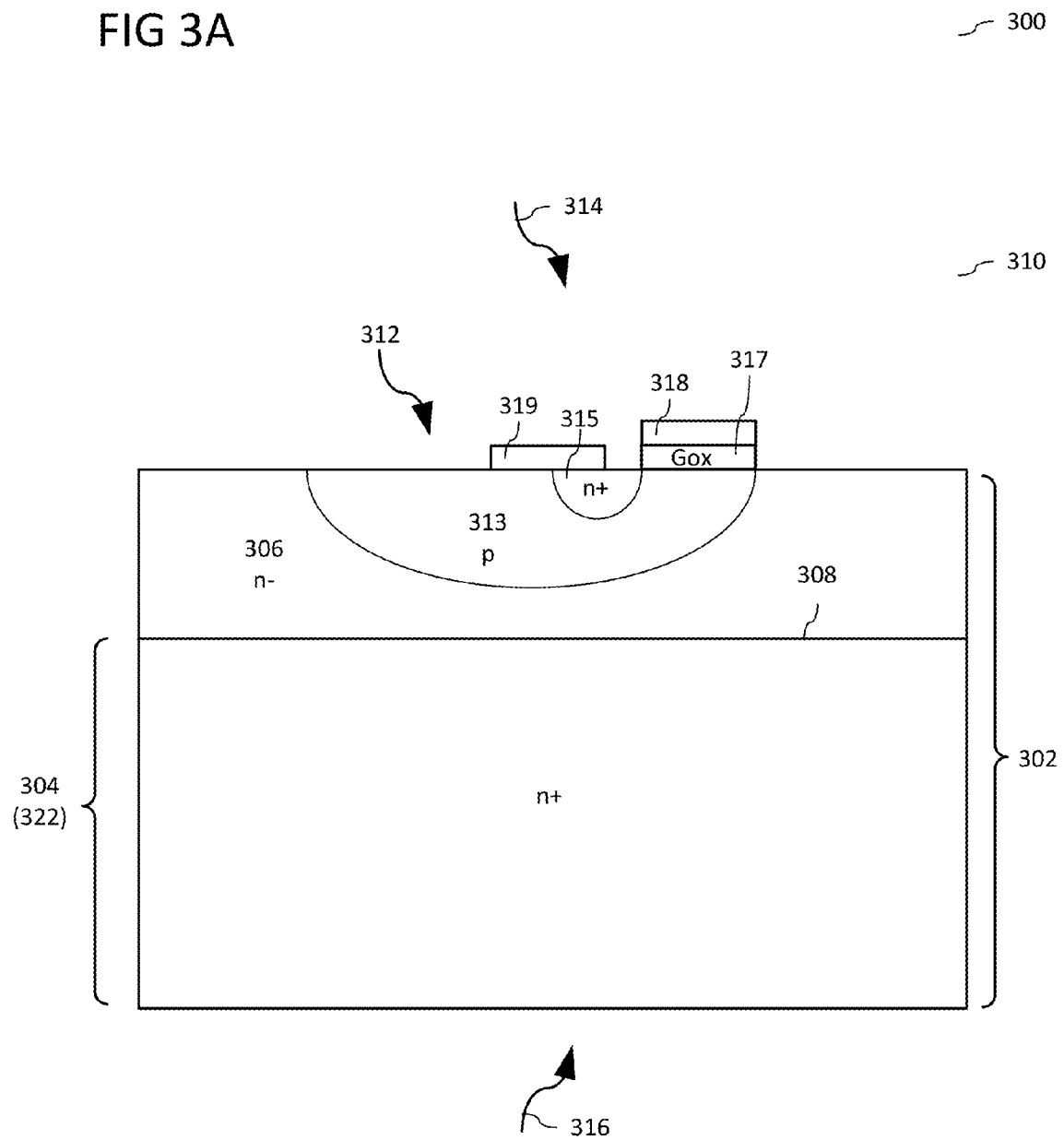
FIGS. 3A to 3G show cross-sectional views illustrating a method for processing a semiconductor carrier according to various embodiments.

The following detailed description refers to the accompanying drawings that show, by way of illustration, specific details and embodiments in which the invention may be practiced.

The word "exemplary" is used herein to mean "serving as an example, instance, or illustration" or the like. Any embodiment or design described herein as "exemplary" is not necessarily to be construed as preferred or advantageous over other embodiments or designs.

The word "over" is used herein to describe forming a feature, e.g. a layer, "over" a side or surface, and may be used to mean that the feature, e.g. the layer may be formed "directly on," e.g. in direct contact with, the implied side or surface. The word "over" may also be used herein to describe forming a feature, e.g. a layer "over" a side or surface, and may be used to mean that the feature, e.g. the layer may be formed "indirectly on" the implied side or surface with one or more additional layers being arranged between the implied side or surface and the formed layer.

Significant problems due to metal contaminants, such as copper contaminants, may lead to changes in the operation of electrical devices in semiconductor chips. For example, copper contamination, from a chip back side may lead to a change in the operation voltage and/or failure in the operation of the devices in the chip. In particular, copper, may move very quickly in silicon even at relatively low temperatures. In power devices, such as power metal oxide semiconductor field effect transistors (MOSFETs), a relatively lowly doped epitaxial layer may be brought over a low ohmic substrate layer. With such low ohmic substrate contacts, glide lines and dislocations may exist in the epitaxial layer, which in case of decoration with heavy metals, may significantly increase leakage current. This may be critical, particularly in cases wherein germanium doping may be omitted from phosphorous doped substrates due to reasons of thermal conductivity.

Various embodiments provide a method for forming a gettering region in a semiconductor wafer substrate. The semiconductor wafer substrate may include silicon, or other semiconductor wafer materials, such as silicon carbide (SiC) or gallium arsenide (GaAs), or gallium nitride (GaN), or indium phosphide (InP).

Various embodiments provide a method for forming a gettering region through which effective gettering of undesired contaminants and foreign atoms may be achieved. For example, effective gettering of metals, e.g. heavy metals, may be possible.

Various embodiments may particularly be directed towards power semiconductor devices, such as metal oxide semiconductor field effect transistors (MOSFETs), diodes, or thyristors with deep back side emitters.

According to various embodiments, a proton-implanted gettering layer may be formed in a semiconductor device, such as a power semiconductor device. In one or more embodiments, a highly doped region may be formed in the power semiconductor device, and the proton-implanted layer may be formed in the highly doped region. Furthermore, the power semiconductor device may be tempered for a length of time at a temperature ranging from about 350° C. to about 550° C., after the implantation, to realize an efficient gettering layer.

FIG. 1A shows method 100 for processing a semiconductor carrier according to an embodiment. Method 100 may include:

providing a semiconductor carrier including a doped substrate region and a device region disposed over a first side of the doped substrate region, the device region including at least part of one or more electrical devices (in 110); and implanting ions into the doped substrate region to form a gettering region in the doped substrate region of the semiconductor carrier (in 120). In one or more embodiments, implanting ions into the doped substrate region may include implanting hydrogen ions into the doped substrate region. In one or more embodiments, implanting ions into the doped substrate region to form a gettering region in the doped substrate region of the semiconductor carrier may include implanting helium ions into the doped substrate region to create intrinsic point defect complexes in the doped substrate region, and in-diffusing hydrogen ions to decorate the intrinsic point defect complexes with hydrogen, the intrinsic point defect complexes decorated with hydrogen forming at least part of the gettering region. In one or more embodiments, the ions may be implanted from a second side of the doped substrate region, wherein the second side faces a direction opposite to a direction which the first side faces. In one or more embodiments, the semiconductor carrier may be annealed subsequent to implanting the ions into the doped substrate region.

FIG. 1B shows method 150 for processing a semiconductor carrier according to an embodiment. Method 150 may include:

providing a semiconductor carrier including a doped substrate region and a device region disposed over a first side of the doped substrate region, the device region including at least part of one or more electrical devices (in 160); and introducing hydrogen ions into the doped substrate region to form a gettering region in the doped substrate region of the semiconductor carrier (in 170). In one or more embodiments, the semiconductor carrier may be annealed subsequent to introducing the hydrogen ions into the doped substrate region.

FIG. 2 shows method 200 for manufacturing a semiconductor device according to an embodiment. Method 200 may include:

providing a semiconductor wafer including a doped substrate region disposed between a front side and a back side of the semiconductor wafer, the semiconductor wafer further including one or more electrical devices formed at least partially at the front side of the semiconductor wafer (in 210); and subsequently introducing hydrogen ions into the doped substrate region from the back side of the semiconductor wafer to form a gettering region in the doped substrate region (in 220). In one or more embodiments, the semiconductor wafer may be annealed subsequent to introducing the hydrogen ions into the doped substrate region.

FIGS. 3A to 3H show cross-sectional views illustrating a method 300 for processing a semiconductor carrier according to various embodiments.

As shown in FIG. 3A in a view 310, method 300 may include providing semiconductor carrier 302 including doped substrate region 304 and device region 306 disposed over first side 308 of doped substrate region 304.

Semiconductor carrier 302 may include a semiconductor wafer substrate, for example, a semiconductor chip or die or a semiconductor wafer in which a plurality of dies may be formed. Semiconductor carrier 302, i.e. the semiconductor wafer and/or chip and/or die, may include at least one material from the following group of materials, the group of materials consisting of: silicon, germanium, III-V semiconductors, II-VI semiconductors, and ternary semiconductor compound materials. For example, semiconductor carrier 302 may include at least one of silicon, silicon carbide (SiC), gallium arsenide (GaAs), gallium nitride (GaN), and indium phosphide (InP).

Semiconductor carrier 302 may include device region 306 which may include at least part of one or more electrical devices 312. In other words, one or more electrical devices 312 may be formed at least partially in device region 306. Device region 306 may generally refer to a region near or at first side 308 of doped substrate region 304. Device region 306 may be formed at front side 314 of semiconductor carrier 302. Semiconductor carrier 302 may also include a back side 316, which faces a direction opposite to a direction which front side 314 faces. Doped substrate region 304 may be disposed between front side 314 and back side 316 of semiconductor carrier 302. Doped substrate region 304 may be disposed between device region 306 and back side 316 of semiconductor carrier 302.

It may be understood that one or more electrical devices 312 may typically be formed during a front end process. The front end process may include front end of line (FEOL) processes, wherein active regions of devices 312 may be manufactured, and back end of line (BEOL) processes, wherein active regions of devices 312 may be selectively and functionally electrically interconnected with each other. One or more electrical devices 312 may be formed at least partially at front side 314 of semiconductor carrier.

Front side 314 may also be referred to as a "first side," "top side" or "upper side" of the semiconductor carrier 302 (e.g. chip). The terms "top side," "first side," "front side" or "upper side" may be used interchangeably hereinafter. Back side 316 may also be referred to as "second side" or "bottom side" of the semiconductor carrier 302 (e.g. chip). The terms "second side," "back side," or "bottom side" may be used interchangeably hereinafter.

The provided semiconductor carrier 302 may have characteristics, e.g. electrical characteristics, which may be dependent on the type of semiconductor devices to be manufactured. Doped substrate region 304 may include an n-type or a p-type semiconductor. In other words, the dominant dopant carriers may be n-type, i.e. donors, or p-type, i.e. acceptors. Doped substrate region 304 may include or be a highly doped region, for example n+ doped, and/or an extremely highly doped region, for example n++ doped. For the case of power devices, doped substrate region 304 may include a dopant carrier concentration exceeding $10^{17}$ cm$^{-3}$, e.g. exceeding $10^{18}$ cm$^{-3}$, e.g. exceeding $10^{19}$ cm$^{-3}$. The device region 306 may generally include a dopant carrier concentration ranging from about $10^{13}$ cm$^{-3}$ to about $10^{16}$ cm$^{-3}$. For example, in cases wherein logic devices are to be manufactured, i.e. wherein one or more electrical devices 312 may be logic devices, device region 306 may include a dopant carrier concentration of about or less than about $10^{16}$ cm$^{-3}$. In some cases wherein power semiconductor devices are to be manufactured, i.e. wherein one or more electrical devices 312 may be power semiconductor devices, device region 306 may include a dopant carrier concentration of about or less than about $10^{14}$ cm$^{-3}$. As an example, doped substrate region 304 and/or device region 306 as shown in FIG. 3A may be doped n-type. In one or more embodiments, device region 306 may include at least part of a drift zone of the one or more electrical devices 312.

It may be understood that semiconductor carrier 302 may include an intrinsic gettering region, such as intrinsic gettering region 322. Intrinsic gettering region 322 may be formed during growth of semiconductor carrier 302, e.g. during growth of the semiconductor wafer substrate, as a result of oxygen being introduced into semiconductor carrier 302 for example, in doped substrate region 304 of semiconductor carrier 302 during a Czochralski growth process of silicon wafers. Typical oxygen concentrations in Czochralski silicon wafers may be at about $10^{18}$ cm$^{-3}$. In particular, supersaturated oxygen precipitates may be formed in semiconductor carrier 302. As a result of oxygen being introduced into semiconductor carrier 302, e.g. in doped substrate region 304, defaults may be formed, which may be trapping sites for metal ion contaminants. These trapping sites may be part of intrinsic gettering region 322. In other words, these trapping sites may be formed in intrinsic gettering region 322. As the gettering efficiency of these precipitates may be limited, additional gettering centers would be desirable.

It may be understood that the semiconductor wafer substrate of semiconductor carrier 302 may not be limited to Czochralski grown wafers, but may generally include any semiconductor wafer substrate, e.g. float zone silicon wafers. Semiconductor carrier 302 may even include silicon wafers grown by magnetic Czochralski methods, wherein oxygen content may be reduced in comparison to conventionally Czochralski grown silicon wafer substrates. For example, magnetic Czochralski grown wafer substrates may have an oxygen concentration of less than about $4\times10^{17}$ cm$^{-3}$. In this case, the oxygen concentration may be too low to form oxygen precipitates and with it oxygen-induced gettering centers.

Device region 306 may be formed away from intrinsic gettering region 322 or vice versa, to ensure that foreign contaminants may be trapped away from device region 306 and hence, away from the one or more electrical devices 312. An example of how this may be achieved, may be by growing an epitaxial layer having low oxygen content, over first side 308 of doped substrate region 304, and forming at least part of one or more electrical devices 312 in the epitaxial layer. In other words, the epitaxial layer, or at least part of the epitaxial layer, may form a denuded zone, and may be device region 306. As another example, which may be especially applicable for the fabrication of logic devices, oxygen, in a surface region, e.g. front side 314, of doped substrate region 304, may be out-diffused of front side 314, to create a surface region with low oxygen content, i.e. a denuded zone. At least part of one or more electrical devices 312 may be formed in the denuded zone. In other words, denuded zone may form at least part of device region 306. In one or more embodiments, electrical device 312 may include or be a transistor (e.g. a power transistor, e.g. a power MOSFET), as shown in FIG. 3A. Electrical device 312 may include for example, a body region 313, e.g. having a doping type opposite to device region 306, e.g. having a p-doping type as shown in FIG. 3A. Electrical device 312 may include for example a source region 315, e.g. having a doping type opposite to body region 313, e.g. having an n+ doping type as shown in FIG. 3A. Electrical device 312 may include a gate insulating layer 317, such as gate oxide (Gox) shown in FIG. 3A, and a gate metallization 318 may be disposed over gate insulating layer 317. It is to be understood, that electrical device 312 may include or be other devices than a transistor in accordance with other embodiments.

As used herein with respect to semiconductor chips which may include at least one of power devices and logic devices, device region 306 may be formed at front side 314, e.g. in the region of front side 314. This may include being formed over and/or directly on a front side 314 surface of semiconductor carrier 302. The terms "top side," "first side," "front side" or "upper side" may be understood to refer to the side of the chip wherein electrical components, e.g. electrically active regions of devices in the chip may be formed. Typically, at least one contact pad, e.g. contact pad 319, may be formed over chip front side 314, wherein the at least one contact pad 319 may be an electrode connected e.g. to the source region 315 and the body region 313 of electrical device 312.

As an example, electrically active regions of devices 312 may include electrical source regions 315, electrical drain regions (which may be provided by doped substrate region 304), electrical channel regions and electrical gate regions. These electrically active regions may form part of one or more electrical devices 312. The one or more electrical devices 312 may each include at least one semiconductor device from the group of semiconductor devices, the group consisting of: a transistor, a metal-oxide semiconductor (MOS) transistor, a bipolar transistor, a field effect transistor, an insulated gate bipolar transistor, a thyristor, a MOS controlled thyristor, a rectifier, a diode, and a Schottky diode.

Figure 3B:
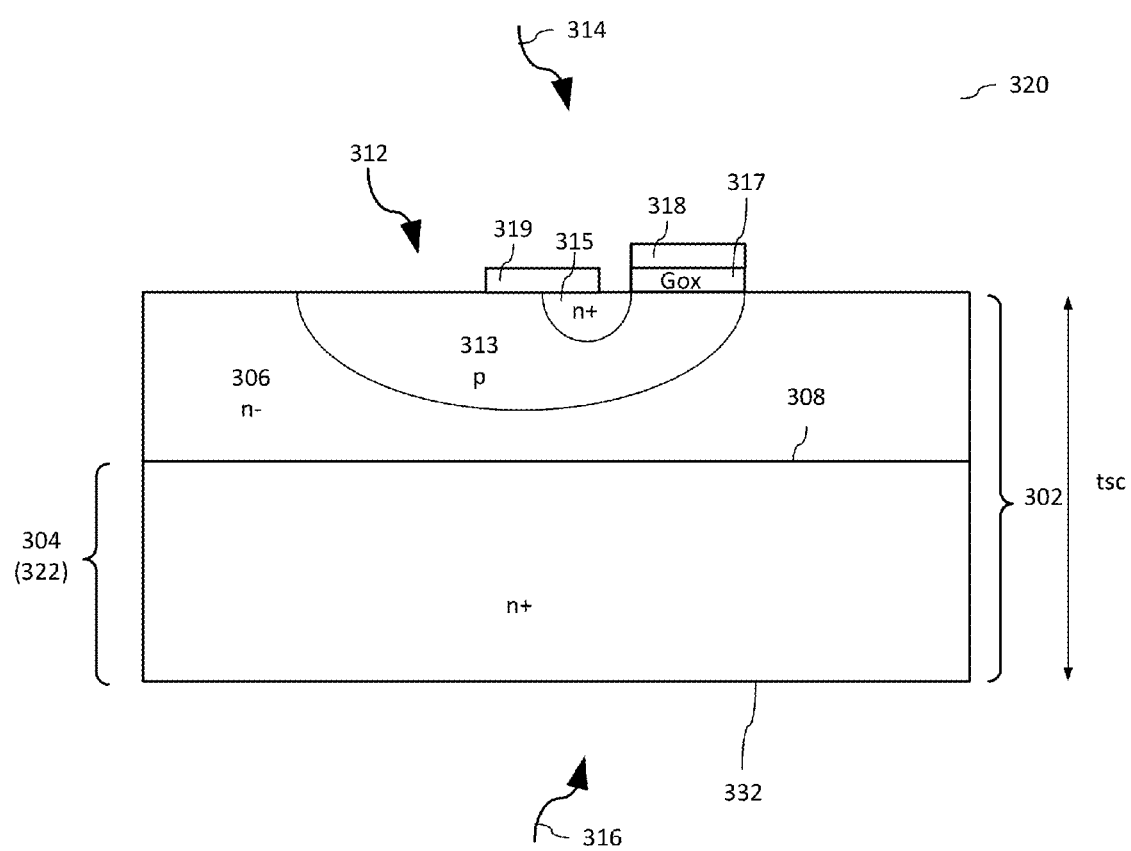

As shown in FIG. 3B in a view 320, doped substrate region 304 may optionally be thinned from second side 332 of doped substrate region 304. Second side 332 may face a direction opposite to a direction which first side 308 faces. Thinning of doped substrate region 304 may take place, for example, by grinding back side 316 of semiconductor carrier 302. In particular, thinned chips may be used for power semiconductor devices, which may support a vertical current flow through the chip, for example between a contact pad (e.g. contact pad 319) at chip front side 314 and a contact pad formed over a chip back side 316. Semiconductor carrier 302 may be thinned to a thickness, tsc, ranging from about 50 µm to about 600 µm, e.g. about 120 µm to about 400 µm, e.g. about 150 µm to about 250 µm.

Figure 3C:
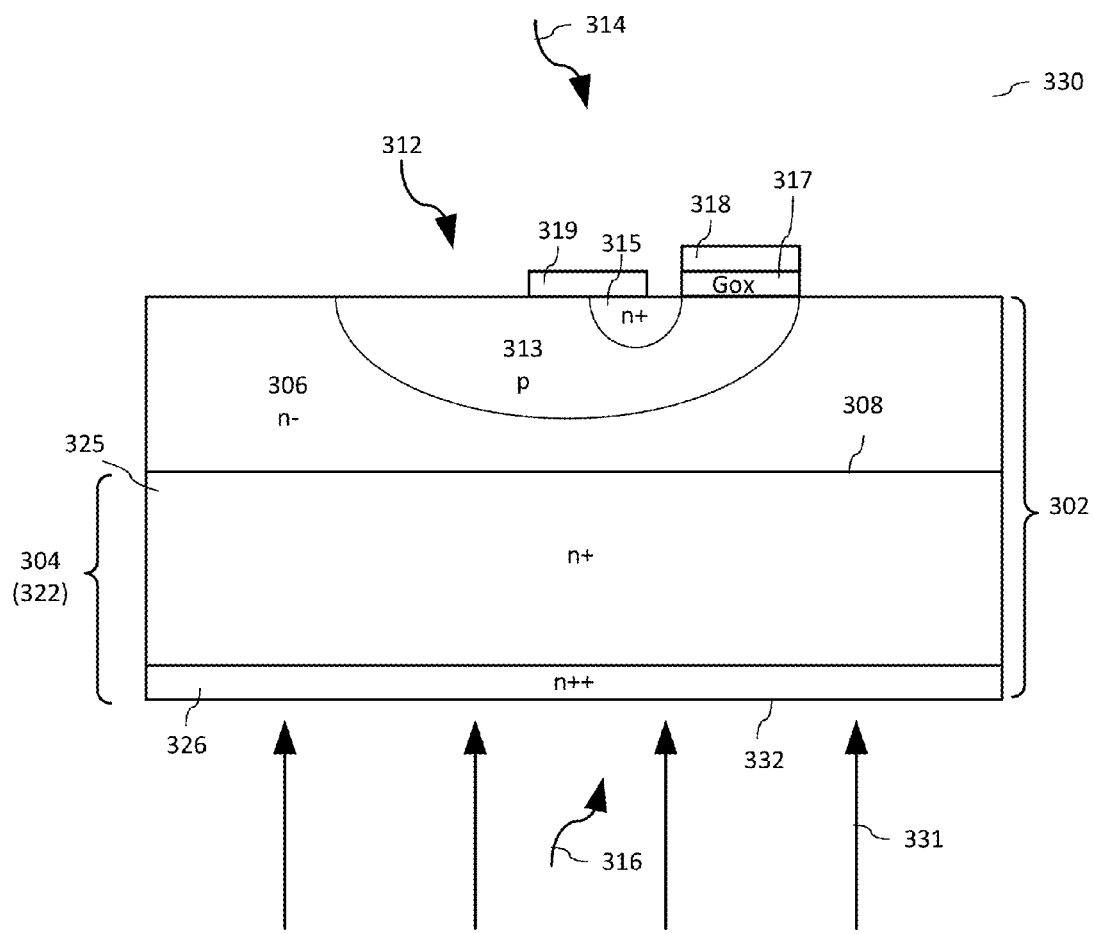

FIG. 3C in view 330, shows the formation of an extremely highly doped region 326 of doped substrate region 304 according to an embodiment. Extremely highly doped region 326 may enable a good ohmic contact between a backside metallization (336, shown later) and the semiconductor device.

Semiconductor carrier 302 may include doped substrate region 304, which may include highly doped region 325 and may also include extremely highly doped region 326. Processing may be carried out to form extremely highly doped region 326 of doped substrate region 304. It may be understood that the processing of semiconductor carrier 302 to form extremely highly doped region 326 may be carried out before or after the formation of one or more electrical devices 312 in semiconductor carrier 302 and/or before or after thinning of doped substrate region 304.

According to some embodiments, extremely highly doped region 326 may be formed by implanting dopant atoms into semiconductor carrier 302, e.g. into substrate region 302, to form extremely highly doped region 326. For example, dopant ions such as phosphorous (n type donors) or boron (p type) may be ion implanted into semiconductor carrier 302, as illustrated by arrows 331 in FIG. 3C. For example, for power semiconductor devices, highly doped region 325 of doped substrate region 304 may have a dopant carrier concentration of more than about $10^{17}$ cm$^{-3}$. For example, for semiconductor logic devices, device region 306 may have a dopant carrier concentration of about or less than about $10^{16}$ cm$^{-3}$. Extremely highly doped region 326 may have a higher dopant concentration than highly doped region 325. Extremely highly doped region 326 may have a dopant concentration greater than or equal to about $10^{19}$ cm$^{-3}$, e.g. greater than or equal to about $4 \times 10^{19}$ cm$^{-3}$, e.g. greater than or equal to about $10^{20}$ cm$^{-3}$. The implantation of dopant atoms may take place before or after the formation of one or more electrical devices 312 in device region 306 and/or before or after thinning of doped substrate region 304.

Figure 3D:
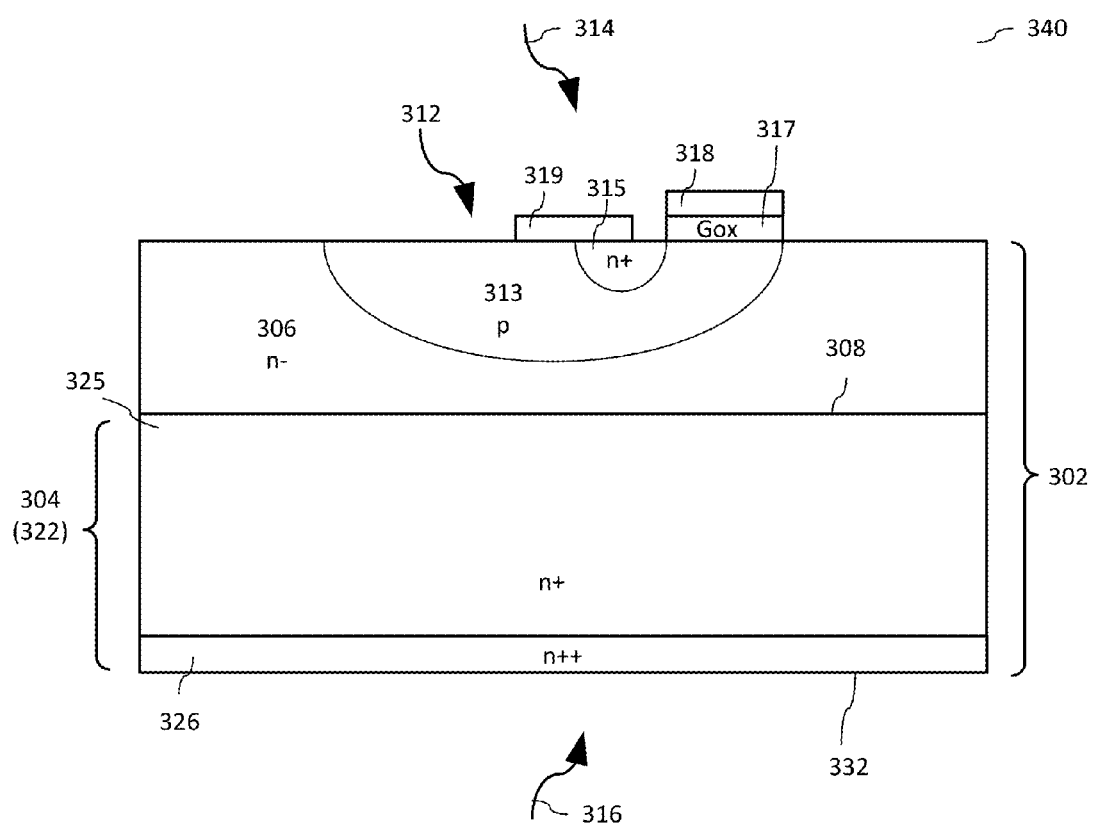

FIG. 3D in view 340, shows the formation of extremely highly doped region 326 of doped substrate region 304 according to another embodiment. According to the embodiment, extremely highly doped region 326 may be formed by growing a highly doped epitaxial layer at second side 332 of doped substrate region 304, e.g. over the bulk region of the semiconductor wafer. The highly doped epitaxial layer may be enriched with dopant atoms during growth or after growth of the highly doped epitaxial layer. The highly doped epitaxial layer may eventually include or become extremely highly doped region 326 having a dopant concentration greater than or equal to about $10^{19}$ cm$^{-3}$, e.g. greater than or equal to about $4 \times 10^{19}$ cm$^{-3}$, e.g. greater than or equal to about $10^{20}$ cm$^{-3}$. The growth of highly doped epitaxial layer may take place before or after the formation of one or more electrical devices 312 in device region 306 and/or before or after thinning of doped substrate region 304.

Figure 3E:
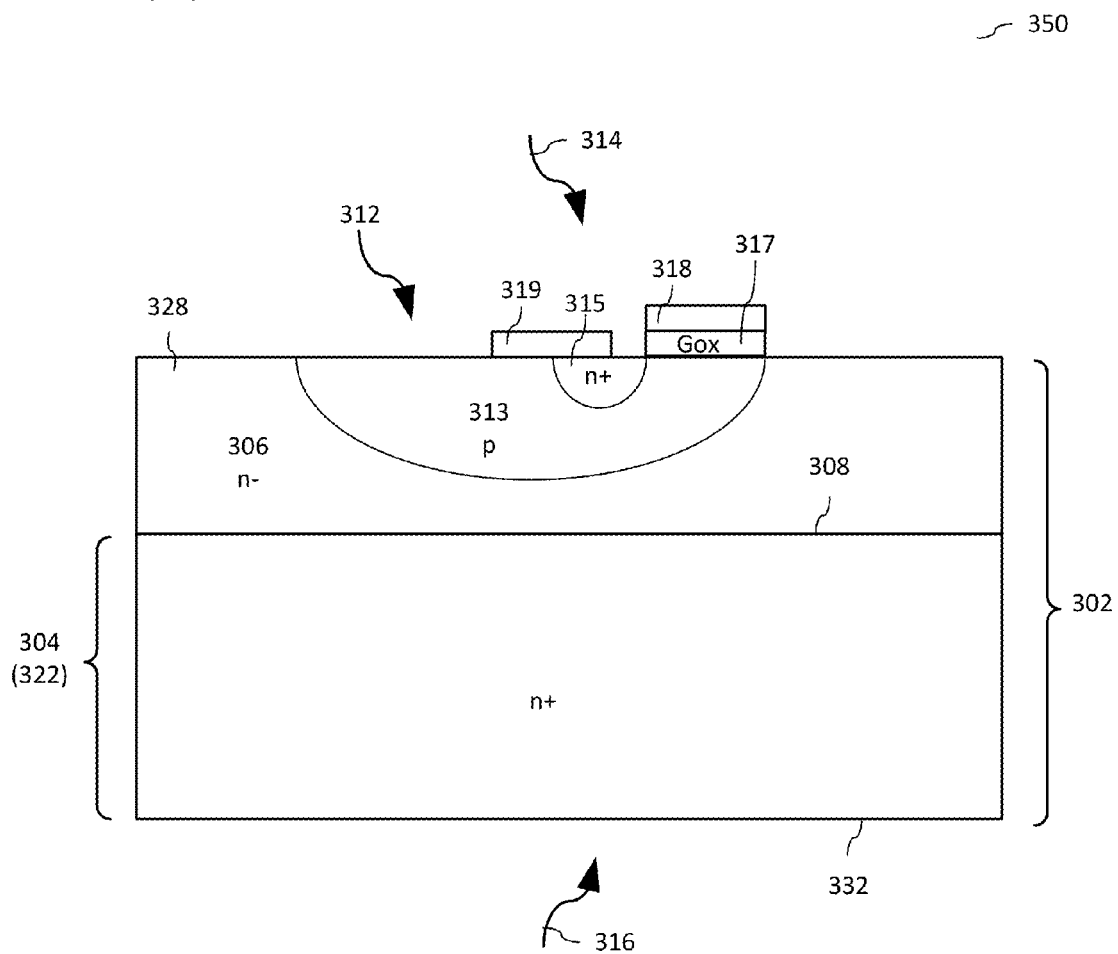

FIG. 3E in view 350, shows the formation of a power device in semiconductor carrier 302 according to another embodiment. According to the embodiment, doped substrate region 304 may be highly doped (e.g. n+ doped, as shown). For example, doped substrate region 304 may be doped with dopant atoms to a dopant concentration greater than or equal to about $10^{17}$ cm$^{-3}$, e.g. greater than or equal to about $10^{18}$ cm$^{-3}$, e.g. greater than or equal to about $10^{19}$ cm$^{-3}$. Epitaxial layer 328 may be grown over first side 308 of doped substrate region 304. Epitaxial layer 328 may include, for example, epitaxially grown silicon. Epitaxial layer 328 may be undoped or may be lightly doped, in other words, having a lower doping concentration than doped substrate region 304. Epitaxial layer 328 may include the denuded zone, i.e. the surface region with little oxygen described earlier in this description. In other words, one or more electrical devices 312 may be formed in epitaxial layer 328. In other words, at least part of epitaxial layer 328 may be device region 306. In other words, the growth of epitaxial layer 328 may take place before the formation of one or more electrical devices 312 in device region 306 and before thinning of doped substrate region 304. It may be understood that according to one or more embodiments, doped substrate region 304 may additionally include an extremely highly doped region (not shown). For example, in one or more embodiments, doped substrate region 304 may include highly doped region 325 and extremely highly doped region 326 described above.

Figure 3F:
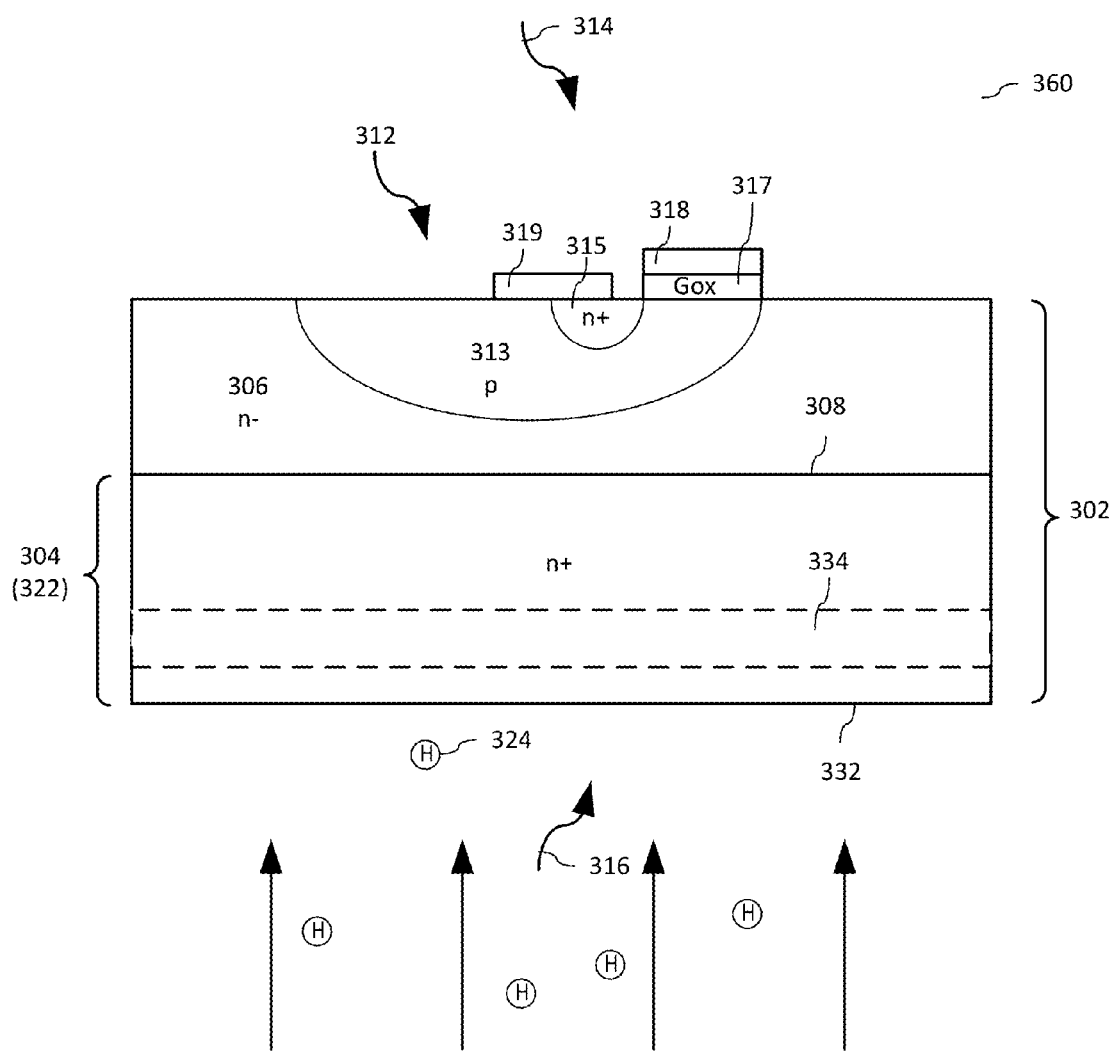
Figure 3G:
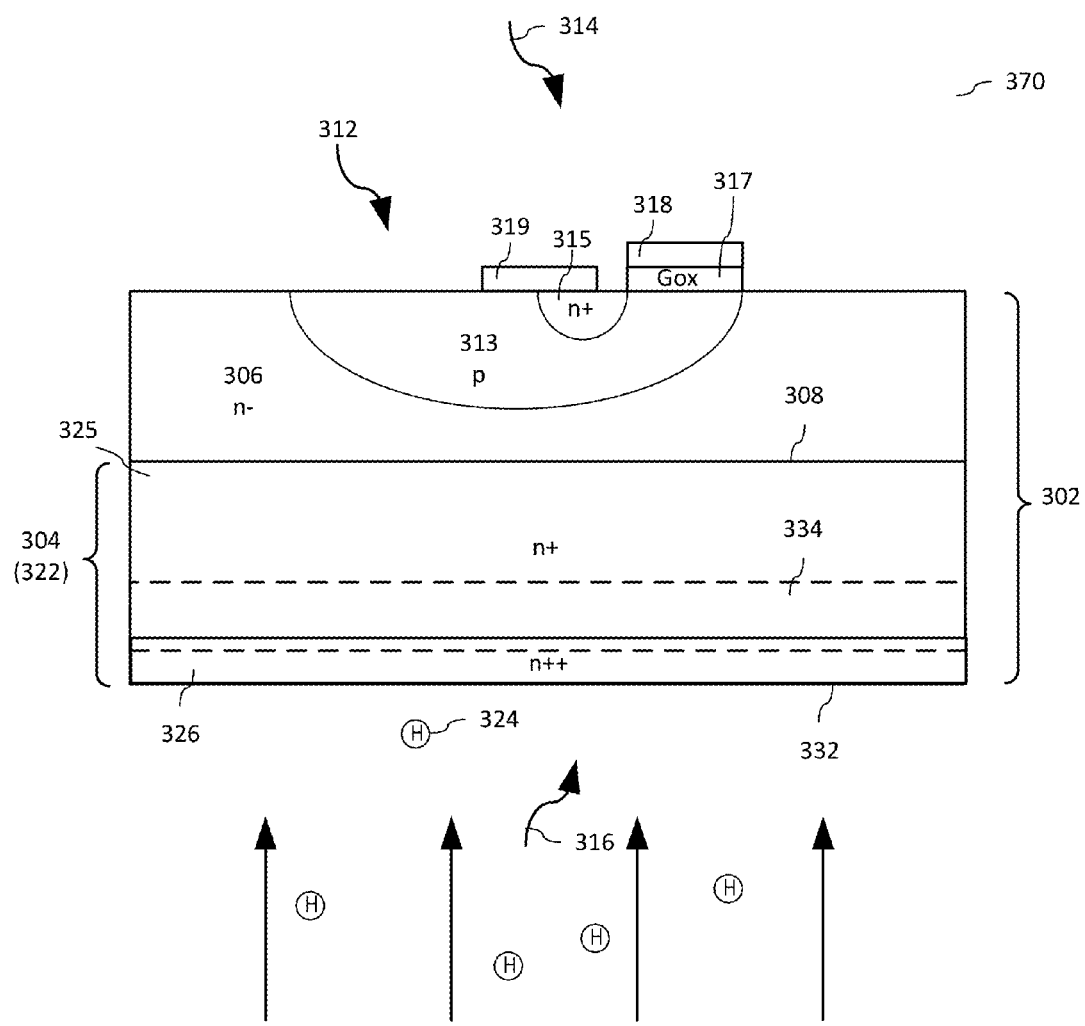

As shown in FIGS. 3F and 3G in views 360 and 370 respectively, hydrogen ions 324 (illustrated by symbol H) may be introduced into doped substrate region 304.

For example, in one or more embodiments, doped substrate region 304 may be highly doped (e.g. n+ doped) and hydrogen ions 324 may be introduced into (highly) doped substrate region 304, as shown in view 360 of FIG. 3F. For example, in one or more embodiments, doped substrate region 304 may include highly doped region 325 (e.g. n+ doped) and extremely highly doped region 326 (e.g. n++ doped) and hydrogen ions 324 may be introduced into highly doped region 325 and/or extremely highly doped region 326, for example into both highly doped region 325 and extremely highly doped region 326, as shown in view 370 of FIG. 3G. Hydrogen ions 324 may be introduced to form gettering region 334 (illustratively demarcated by dotted lines) in doped substrate region 304, for example in highly doped substrate region 304 (as shown in view 360 of FIG. 3F) or in highly doped region 325 and/or extremely highly doped region 326 of doped substrate region 304 (as shown in view 370 of FIG. 3G).

As shown in view 370, hydrogen ions 324 may be introduced into doped substrate region 304 subsequent to or prior to forming extremely highly doped region 326. In other words, doped substrate region 304 may include highly doped region 325 and extremely highly doped region 326, and gettering region 334 may be formed in highly doped region 325 and/or in extremely highly doped region 326 of doped substrate region 304. Extremely highly doped region 326 shown illustratively in FIG. 3G, may have been formed according to at least one of the processes already described with respect to FIGS. 3C and 3D.

Hydrogen ions 324 may be introduced into doped substrate region 304, for example into highly doped substrate region 304 shown in view 360, or into highly doped region 325 and/or extremely highly doped region 326 of doped substrate region 304 shown in view 370, from back side 316 of semiconductor carrier 302, e.g. from second side 332 of doped substrate region 304.

Hydrogen ions 324 may be introduced by implanting protons, e.g. H$^+$, to form gettering region 334. Hydrogen ions 324 may be implanted with a radiation energy ranging e.g. from about 100 keV to about 10 MeV, e.g. from about 1 MeV to about 10 MeV, e.g. from about 1 MeV to about 5 MeV, e.g. from about 3 MeV to about 5 MeV. However, it may be understood that the radiation energy may not be limited to this range, and may include other ranges according to other embodiments. The high energy proton implantation may result in a substantially vertical extended defect region. Hydrogen ions 324 may be implanted to a depth ranging from about 1 μm to about 500 μm from second side 332 of substrate region 304. The introduction of hydrogen ions 324 may create defects, such as intrinsic point defect complexes. These point defect complexes may include single vacancy or multi-vacancy complexes formed in the crystalline or substantially crystalline structure of doped substrate region 304. These point defect complexes may be formed due to the penetration of hydrogen ions 324 into doped substrate region 304.

In one or more embodiments, the implantation dose of the hydrogen ions 324 may range from about $10^{13}$ cm$^{-2}$ (hydrogen ions per cm$^2$) to about $10^{15}$ cm$^{-2}$ (hydrogen ions per cm$^2$), for example from about $5 \times 10^{13}$ cm$^{-2}$ to about $5 \times 10^{14}$ cm$^{-2}$, for example from about $10^{14}$ cm$^{-2}$ to about $3 \times 10^{14}$ cm$^{-2}$.

Heating, e.g. annealing, of semiconductor carrier 302 may be carried out at a temperature ranging from about 350° C. to about 550° C., e.g. from about 400° C. to about 500° C., subsequent to introducing the hydrogen ions into doped substrate region 304. The heating time may range from about 0.5 hours to several hours, e.g. between about 0.5 hour to about 10 hours, e.g. between about 1 hour to about 4 hours. However, it may be understood that the heating time may not be limited to this range, and may include other lengths of times according to other embodiments. The heating process may result in the creation of hydrogen-decorated intrinsic point defect complexes in doped substrate region 304, for example in highly doped substrate region 304 shown in view 360, or in highly doped region 325 and/or extremely highly doped region 326 of doped substrate region 304 shown in view 370. The hydrogen-decorated intrinsic point defect complexes may be stable up to 550° C.

The creation of hydrogen-decorated intrinsic point defect complexes, may result or form a gettering region 334 with n-type dopant behavior. These annealed hydrogen-decorated intrinsic point defect complexes forming gettering region 334 are thermally more stable than non-hydrogen decorated point defects formed, e.g. by He' without hydrogen. By hydrogen decorated intrinsic point defect complexes the gettering layer may become adequately stable to withstand the thermal budget of all back end of line (BEOL) processes which typically are performed in the temperature range between 150° C. and 400° C. Due to the annealing, the hydrogen decorated intrinsic point defect complexes may act as gettering centers for heavy metal contamination, without being scattering centers for free charge carriers. This means that the mobility of free charge carriers within the gettering region is nearly unchanged so that the on-state power losses of vertical power devices can be minimized. The hydrogen-decorated intrinsic point defect complexes may refer to vacancy complexes, e.g. single vacancies or multi vacancies formed in the crystalline structure of the doped substrate region 304, wherein the vacancy complexes may be decorated with hydrogen.

The hydrogen-decorated intrinsic point defect complexes may be formed within gettering region 334. The density of the hydrogen-decorated intrinsic point defect complexes and with it the resulting donor concentration may be less than about $10^{17}$ cm$^{-3}$, e.g. less than about $5 \times 10^{16}$ cm$^{-3}$, e.g. less than about $1 \times 10^{16}$ cm$^{-3}$. The doping concentration of (highly) doped substrate region 304, or of highly doped region 325 and extremely highly doped region 326 of doped substrate region 326, may be selected such that (highly) doped substrate region 304, or highly doped region 325 and extremely highly doped region 326 of doped substrate region 304, may each have a doping concentration higher than a doping concentration provided by the hydrogen-decorated intrinsic point defect complexes. For example, the doping concentration of (highly) doped substrate region 304 shown in view 360 or of highly doped region 325 shown in view 370 may be several times, e.g. ten or more times, higher than a doping concentration provided by the hydrogen-decorated intrinsic point defect complexes, and/or the doping concentration of extremely highly doped region 326 shown in view 370 may be e.g. about a hundred or more than thousand times higher than a doping concentration provided by the hydrogen-decorated intrinsic point defect complexes. Thus, it may be prevented that the hydrogen-induced donor doping has a significant negative impact on the resistance of the substrate region 304 and thus, e.g., on the on-state voltage of the semiconductor devices (e.g. power devices). For example, for a p-type doped substrate region 304, doping the substrate region 304 with a sufficiently high p-type carrier concentration may prevent that the n-type dopant behavior of the hydrogen-induced doping concentration may lead to a significant counter-doping in the substrate region 304 and thus to a detrimental increase of the on-state voltage of the devices.

Figure 4A:
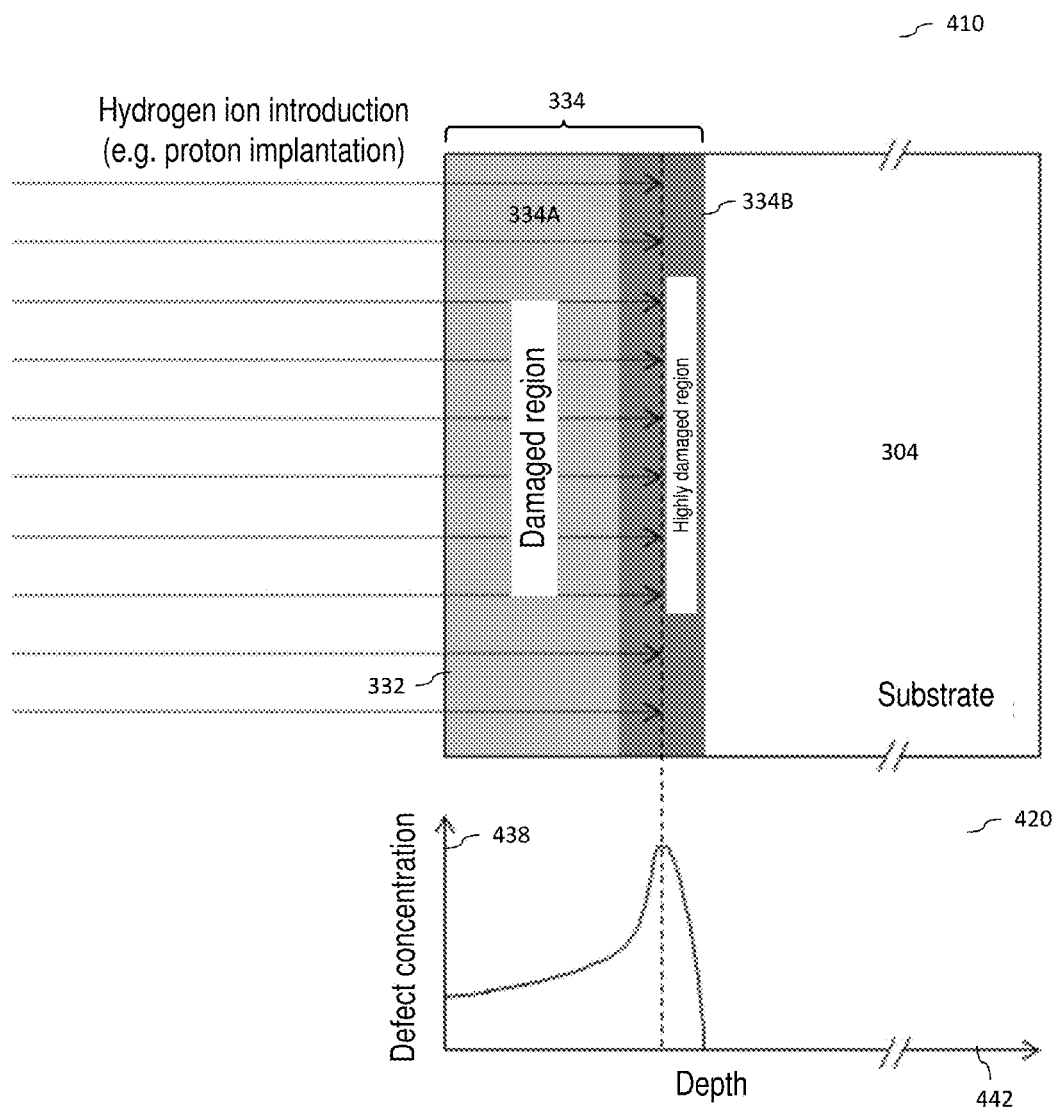
FIG. 4A shows an illustration of defect or donor distribution with respect to sample depth after an annealing process.

FIG. 4A shows schematic 410 illustrating the defect distribution in a substantially vertical direction, i.e. depth through the sample and the resulting donor distribution after the temper, i.e. annealing, process. Defect concentration 438 as a function of sample depth 442 is shown in graph 420. A damaged region 334A, formed by defects, may be formed in doped substrate region 304 from second side 332, the side from which hydrogen ions may be introduced. A peak concentration in the resulting defect distribution, i.e. a highly damaged region 334B, may be achieved at a distance, from second side 332 of doped substrate region 304. The depth at which the highly damaged region 334B is formed and its concentration, may be controlled by a combination of parameters related to the implantation energy and the dose. For example, a depth of approximately 1 μm may be achieved from an implantation energy of about 100 keV. For example, a depth of approximately 10 μm may be achieved from an implantation energy of about 1 MeV. Defect concentration 438 may transform into an n-type (donor) like doping distribution upon annealing by complex formation of hydrogen atoms with defects. Damaged region 334A and/or highly damaged region 334B may form at least part of gettering region 334. It should be noted that the donor-like behavior of the complexes may usually vanish or be at least locally reduced after the decoration of the gettering centers with heavy metals. Therefore, in accordance with one or more embodiments it may be provided that the substrate doping is much higher than the proton-induced doping to avoid undesired significant changes of the electrical behavior of the devices. This is illustrated e.g. in FIG. 4B, where the undesired and detrimental creation of a pn-junction can be seen which would result in a drastic change of the electrical behavior of the devices.

If doped substrate region 304 is not yet thinned as described according to FIG. 3B, then doped substrate region 304 may be thinned from second side 332 of doped substrate region 304, after the introduction of hydrogen ions. It may therefore be understood that the penetration depth of introduction of hydrogen ions may be controlled, depending on whether the hydrogen ions are introduced into a thinned substrate region or an un-thinned substrate region, in other words, to ensure that the defects decorated with hydrogen may be formed in the doped substrate region 304, or for example, in the highly doped region 325 and/or extremely highly doped region 326 of doped substrate region 304. It may be understood, therefore, that doped substrate region 304 may be thinned from second side 332 of doped substrate region 304 before or after the introduction of hydrogen ions into doped substrate region 304.

It may be understood that the introduction of hydrogen for forming gettering region 334 as described according to FIG.

3F and FIG. 3G may not be limited to the implantation of protons. According to other embodiments, introducing hydrogen ions into doped substrate region 304 may include implanting helium, e.g. $He^+$, into doped substrate region 304 to create intrinsic point defect complexes in doped substrate region 304, or in highly doped region 325 and/or extremely highly doped region 326 of doped substrate region 304. Additionally, in-diffusion of hydrogen ions may be carried out using a hydrogen plasma, e.g. $H_2$ plasma prior, during or subsequent to implanting helium. The in-diffusion of hydrogen ions may decorate the intrinsic point defect complexes with hydrogen. The intrinsic point defect complexes decorated with hydrogen may form at least part of gettering region 334.

Figure 3H:
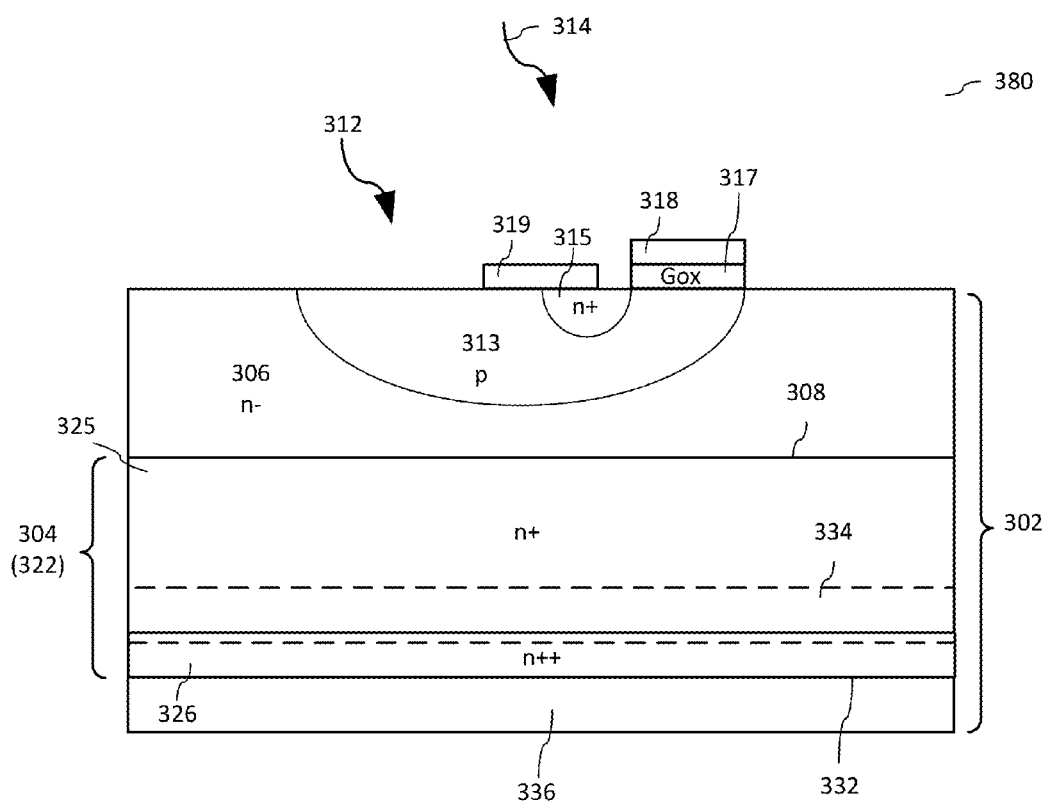
FIG. 3H shows a semiconductor chip arrangement manufactured according to various embodiments.

As shown in FIG. 3H in a view 380, subsequently a metal layer 336 may be formed over second side 332 of doped substrate region 304. A semiconductor chip arrangement manufactured according to embodiments described with respect to method 300 is shown in FIG. 3H.

According to some embodiments, metal layer 336 may include a back side metallization layer, which may include at least one material from the following group of materials, the group of materials consisting of: copper, aluminum. It may be understood that according to some embodiments, back side metallization layer 336 may be adhered to second side 332 of doped substrate region 304, e.g. by means of a die attach material, which may include an electrically conductive glue, or paste, or solder. According to other embodiments, back side metallization layer 336 may be deposited over second side 332 of doped substrate region 304. For example, back side metallization layer 336 may be plated, e.g. electroplated, over second side 332 of doped substrate region 304.

According to other embodiments, metal layer 336 may include a direct copper bonded (DCB) substrate. A DCB may include a dielectric and/or ceramic layer, wherein a copper layer, e.g. a foil, may be formed on a side of the dielectric and/or ceramic layer. The copper layer of the DCB substrate, i.e. metal layer 336 may be formed or adhered over second side 332 of doped substrate region 304.

It may be understood therefore, that in one or more embodiments, e.g. in power devices, an extrinsic gettering region, in the form of gettering region 334 may be additionally formed between metal layer 336 and a drift zone of one or more electrical devices 312, wherein the drift zone may be formed at least partially in device region 306. In particular, gettering region 334 may prevent foreign atoms, e.g. from back side metallization layers and/or DCB substrates and/or solder materials, from reaching the drift zone. Gettering region 334 may also prevent contaminants from reaching gate oxides (e.g. Gox of electrical device 312 in figures) of the devices on the front side of power and/or logic semiconductor devices.

Figure 4B:
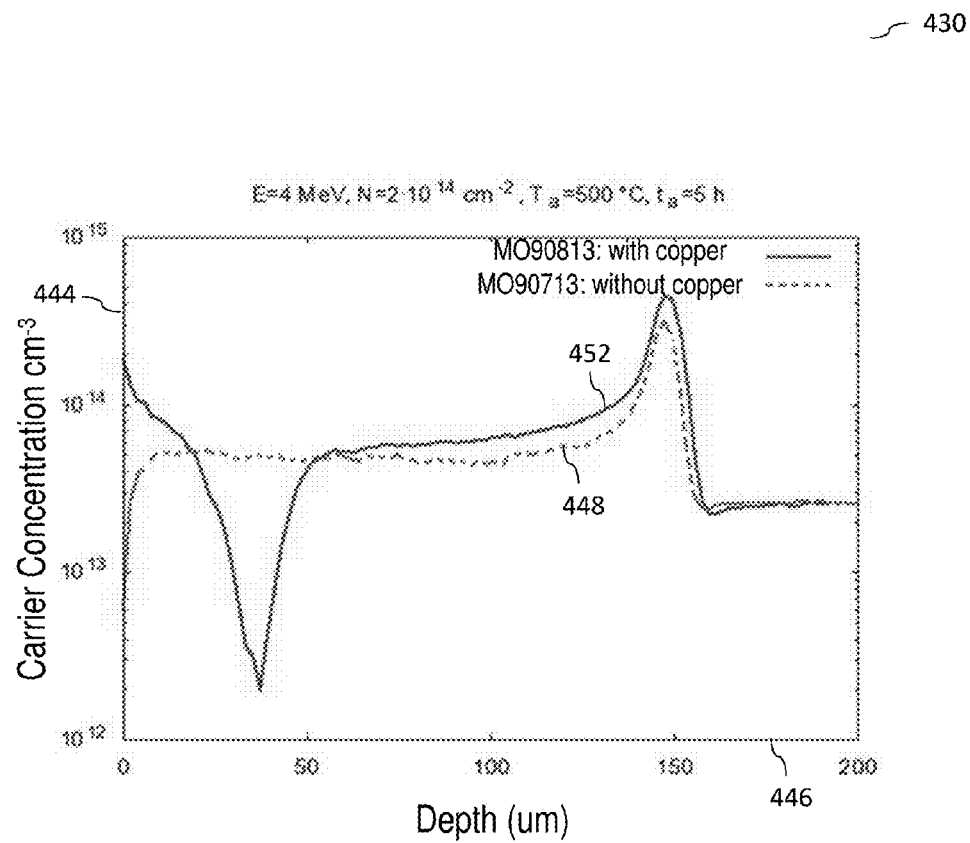
FIG. 4B shows a graph illustrating the variation of induced donor carrier concentration ($cm^{-3}$) with respect to penetration depth and the effect of copper contaminants on the induced donor carrier concentration.

Graph 430 shown in FIG. 4B, illustrates the variation of induced donor carrier concentration ($cm^{-3}$) 444 with respect to penetration depth 446 and the effect of copper contaminants on the induced donor carrier concentration.

Dotted line 448 shows a peak in induced donor concentration at a penetration depth of approximately 150 µm. It may be understood, that generally, the penetration depth may be controlled by the implantation energy. The getter effectiveness may also be controlled by the implantation energy and the proton dose. The higher the proton dose, the higher the concentration of the proton induced n-doped vacancies and the more effective the capture of heavy metals.

Line 452 shows a concentration of induced donor carriers when copper contamination may be introduced into semiconductor carrier 302. Copper atoms may diffuse from a side of the substrate, e.g. back side 332 of doped substrate region 304, through the proton doped regions, e.g. 334A and 334B, and may be bound by those regions in a stable manner, for example even up to about 500° C. The diffusion constant of the copper atoms in the proton-doped regions may be greatly reduced. Copper atoms which may have diffused from the wafer back side 332 may lead to a stable inversion of the doping in the regions of semiconductor carrier 302 doped substrate region 304 up to about 50 µm, wherein the copper atoms may attach to the n-doped proton irradiated complexes and may lead to acceptor-like levels. This can be shown by the sharp reduction of n-doped proton irradiated complexes at about 50 µm.

For depths larger than 50 µm, the proton induced donor profile may be largely unchanged. In other words, due to the getter effectiveness of the highly damaged zone 334b and in general gettering region 334, the foreign contaminants may not penetrate in significant amounts, into the deeper regions of doped substrate region 304 (for example, regions of the doped substrate region 304 proximate the device region 306). It may be understood that in FIG. 4B, the proton induced donor profile in line 452 is shown to be even higher doped, than in line 448 at depths larger than 50 µm, however this is likely to be due to inaccuracy of spreading resistance analysis measurements over temperature.

It may be understood that FIG. 4B shows the effectiveness of hydrogen-decorated intrinsic point defect complexes against metal contaminants according to various embodiments. As already mentioned, the aforementioned change of the doping level might have a negative impact on the device performance, if the doping concentration of the substrate layer is not significantly higher than the proton-induced donor doping.

Furthermore, it may be understood that, despite the effectiveness in gettering provided by the hydrogen decorated intrinsic point defect complexes, it may be possible, that the induced parasitic n-type doping of the hydrogen decorated intrinsic point defect complexes may introduce parasitic doping effects which may affect the one or more electrical devices 312. Therefore, in accordance with one or more embodiments, hydrogen may be introduced, e.g. implanted, into a highly doped substrate region 304, or into a highly doped region 325 and/or an extremely highly doped region 326 of a doped substrate region 304, having a doping concentration higher than a doping concentration provided by the hydrogen-decorated intrinsic point defect complexes. The highly doped substrate region 304, or the highly doped region 325 and/or extremely highly doped region 326 of a doped substrate region 304, may be able to avoid any influence of the induced n-typed doping concentration provided by the hydrogen-decorated intrinsic point defect complexes. In other words, highly doped substrate region 304, or highly doped region 325 and/or extremely highly doped region 326 of doped substrate region 304, may be able to hide the parasitic doping effect of the induced n-doped region. Furthermore, the additional doping by the hydrogen-decorated intrinsic point defect complexes may not adversely influence the mobility of free charge carriers due to annealing at temperatures greater than 350° C., or affect the turn-on resistance Ron in device region 306. Therefore, a substantial increase in the turn-on resistance or blocking voltage of the one or more electrical devices 312, e.g. power MOSFETS may be avoided. Furthermore, as the hydrogen-decorated intrinsic point defect complexes may be formed in highly doped substrate region 304, or in highly doped region 325 and/or extremely highly doped region 326 of doped substrate region 304, the complexes may not have a negative influence on the leakage current of the one or more electrical devices 312, since gettering region 334 may be placed and/or positioned such that it lies outside of the space charge region forming during latched and/or blocking voltage operations. Through the heating, e.g. the annealing or tempering process after introduction of hydrogen ions, a significant reduction in the mobility in the free charge carriers may be avoided.

Metal contaminants may be effectively gettered by the gettering region 334, whether the metal contaminants penetrate semiconductor carrier 302 from the carrier front side 314 or back side 316.

Figure 5:
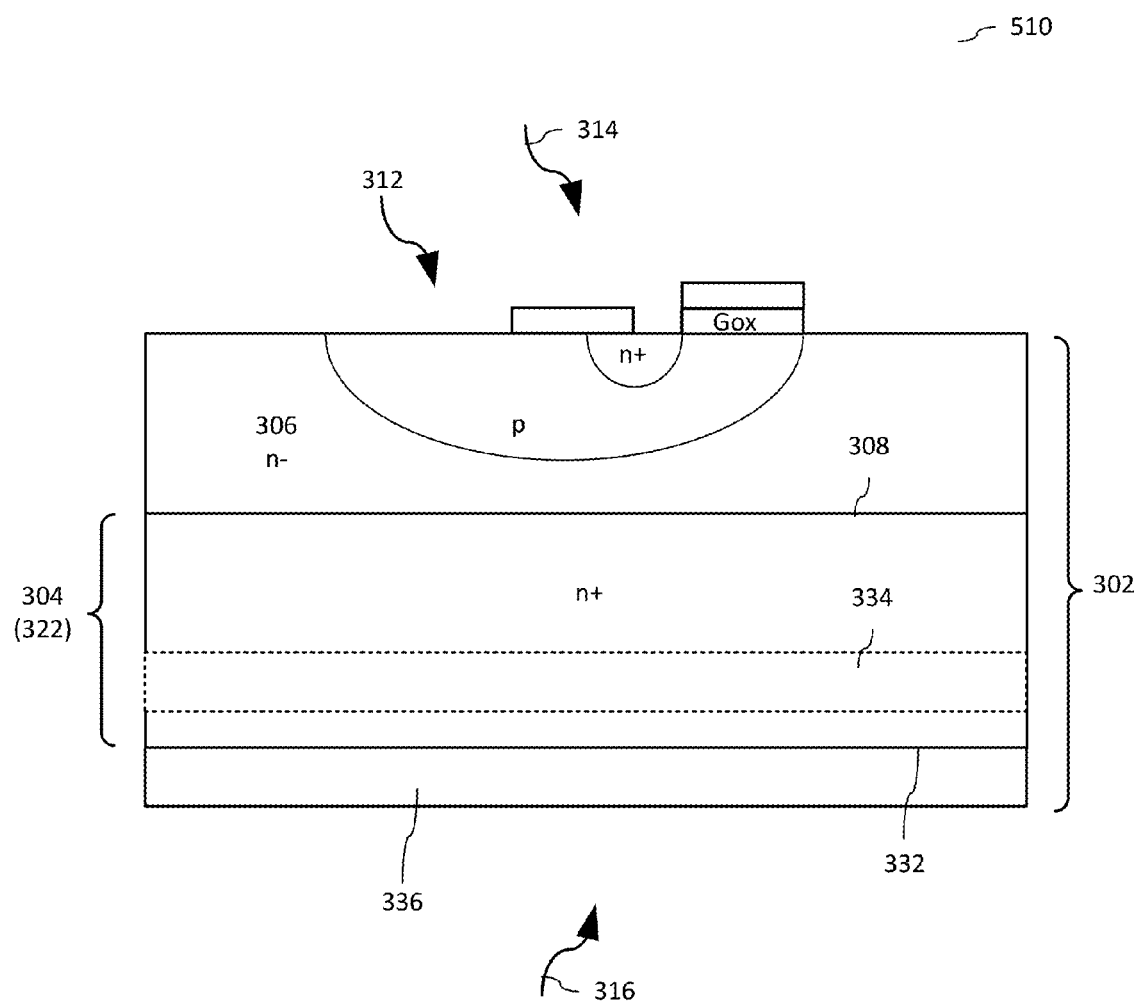
FIG. 5 shows a semiconductor chip arrangement according to an embodiment.

FIG. 5 shows semiconductor chip arrangement 510 according to an embodiment. Semiconductor chip arrangement 510 may be manufactured according to any of methods 100, 200 or 300, and may include one or more or all of the features already described in accordance with methods 100, 200 or 300.

Semiconductor chip arrangement 510 may include: semiconductor carrier 302 (e.g. wafer) including doped substrate region 304 and device region 306 disposed over first side 308 of doped substrate region 304; one or more electrical devices 312 formed at least partially in device region 306 of semiconductor carrier 302; gettering region 334 including hydrogen-decorated intrinsic point defect complexes formed in doped substrate region 304 of semiconductor carrier 302; and metal layer 336 disposed over second side 332 of doped substrate region 304.

In accordance with various embodiments, a maximum concentration of point defects (e.g. vacancies) and with it the highest density of gettering centers may be in the depth of the doped substrate region 304, e.g. in the region of the end-of-range (EOR) of the hydrogen ion implantation. Thus, the gettering efficiency may be chosen very high close to the interface between the doped substrate region 304 and the device region 306, which may result in a relatively efficient gettering of contaminating atoms, diffusing from the front side 314 into deeper regions of semiconductor carrier 302 (e.g. wafer). This may result in a relatively clean drift zone and with it in low leakage currents.

Thus, in various embodiments, a maximum or highest density of gettering centers may be located within or close to an end-of-range (EOR) region of the hydrogen ion implantation. In one or more embodiments, the end-of-range region and/or maximum density of gettering centers may be located at a depth in the doped substrate region 304 that corresponds to greater than or equal to about 30% and less than 100% of the vertical extent or thickness of the doped substrate region 304, for example at a depth that corresponds to greater than or equal to about 50% and less than 100% of the vertical extent or thickness of the doped substrate region 304, wherein the depth may be measured from the second side 332 of the doped substrate region 304 (see also FIG. 4A).

The region between the end-of-range (EOR) region and the rear surface or second side 332 of the doped substrate region 304, into which the hydrogen ions (e.g. protons) are implanted, may also exhibit a significant density of gettering centers, but this density may be lower than in the end-of-range region, for example by a factor of at least 3 lower than in the end-of-range in accordance with some embodiments, for example by a factor of at least 5 lower than in the end-of-range in accordance with some embodiments, for example by a factor of 5 to 10 lower than in the end-of-range in accordance with some embodiments.

According to some embodiments, doped substrate region 304 may include or be a highly doped region and gettering region 334 may be formed at least partially in the highly doped region. According to another embodiment, the doped substrate region 304 may include a highly doped region 325 and an extremely highly doped region 326 (not shown in FIG. 5, see e.g. FIG. 3G), wherein gettering region 334 may be formed in highly doped region 325 and/or extremely highly doped region 326 of doped substrate region 304. Extremely highly doped region 326 and highly doped region 325 may have a doping concentration higher than a concentration of the hydrogen-decorated intrinsic point defect complexes. Device region 306 may include a dopant carrier concentration of less than about $10^{16}$ cm$^{-3}$. The concentration of the hydrogen-decorated intrinsic point defect complexes may be less than about $10^{17}$ cm$^{-3}$, e.g. less than about $5 \times 10^{16}$ cm$^{-3}$, e.g. less than about $1 \times 10^{16}$ cm$^{-3}$ or e.g. less than about $10^{15}$ cm$^{-3}$. Metal layer 336 may include a back side metallization layer including at least one material from the following group of materials, the group of materials consisting of: copper, aluminum.

It may be understood that various embodiments may provide a semiconductor chip arrangement, or semiconductor device, wherein an extrinsic gettering region, i.e. gettering region 334, may additionally exist in an end product, e.g. a final chip. This gettering region 334 may provide gettering of metal contaminants from metals formed at the front side 314 of the semiconductor carrier 302, e.g. contact pads and/or interconnects metals, or at the back side 316 of semiconductor carrier 302, e.g. DCB materials, and/or back side metallization materials, and/or die attach materials, e.g. solder materials. In contrast, conventional extrinsic gettering layers which may be manufactured according to traditional processes, e.g. polysilicon gettering layers, may normally be deposited on a back side 316 of a wafer, and removed, e.g. during a wafer thinning process; i.e. in some cases these layers are removed prior to the last thermal treatment of the wafers so that the risk of the in-diffusion of heavy metals is high. Traditional intrinsic and extrinsic gettering regions may typically be removed from the wafer and may not exist in the final product.

Various embodiments provide a method for processing a semiconductor carrier, the method including: providing a semiconductor carrier including a doped substrate region and a device region disposed over a first side of the doped substrate region, the device region including at least part of one or more electrical devices; and implanting ions into the doped substrate region to form a gettering region in the doped substrate region of the semiconductor carrier.

According to an embodiment, implanting ions into the doped substrate region includes implanting hydrogen ions into the doped substrate region.

According to an embodiment, implanting ions into the doped substrate region to form a gettering region in the doped substrate region of the semiconductor carrier includes: implanting helium ions into the doped substrate region to create intrinsic point defect complexes in the doped substrate region, and in-diffusing hydrogen ions to decorate the intrinsic point defect complexes with hydrogen, the intrinsic point defect complexes decorated with hydrogen forming at least part of the gettering region.

According to an embodiment, implanting ions into the doped substrate region includes implanting the ions into the doped substrate region from a second side of the doped substrate region, wherein the second side faces a direction opposite to a direction which the first side faces.

According to an embodiment, the method further includes annealing the semiconductor carrier subsequent to implanting the ions into the doped substrate region.

According to an embodiment, annealing the semiconductor carrier is carried out at a temperature ranging from about 350° C. to about 550° C.

According to an embodiment, the doped substrate region has a dopant carrier concentration of greater than or equal to about $10^{17}$ cm$^{-3}$.

According to an embodiment, the ions are implanted into the doped substrate region to a depth ranging from about 1 μm to about 500 μm from the second side of the doped substrate region.

According to an embodiment, the device region is formed by growing an epitaxial layer over the first side of the doped substrate region, the epitaxial layer having a lower doping concentration than the doped substrate region; and the method includes forming the one or more electrical devices in the epitaxial layer having the lower doping concentration than the doped substrate region.

According to an embodiment, the method further includes thinning the doped substrate region from the second side of the doped substrate region before implanting the ions into the doped substrate region.

According to an embodiment, the method further includes forming a metallization layer over the second side of the doped substrate region after implanting the ions into the doped substrate region.

Various embodiments provide a method for processing a semiconductor carrier, the method including: providing a semiconductor carrier including a doped substrate region and a device region disposed over a first side of the doped substrate region, the device region including at least part of one or more electrical devices; and introducing hydrogen ions into the doped substrate region to form a gettering region in the doped substrate region of the semiconductor carrier.

According to an embodiment, the method further includes: annealing the semiconductor carrier subsequent to introducing the hydrogen ions into the doped substrate region.

According to an embodiment, annealing the semiconductor carrier is carried out at a temperature ranging from about 350° C. to about 550° C.

According to an embodiment, the doped substrate region includes a highly doped region; and introducing hydrogen ions into the doped substrate region includes introducing the hydrogen ions into the highly doped region to form the gettering region at least partially (e.g. completely, according to an embodiment) in the highly doped region.

According to an embodiment, the highly doped region includes a dopant carrier concentration of greater than or equal to about $10^{17}$ cm$^{-3}$.

According to an embodiment, introducing hydrogen ions into the doped substrate region to form a gettering region in the doped substrate region of the semiconductor carrier includes implanting the hydrogen ions (e.g. protons, according to an embodiment) into the doped substrate region.

According to an embodiment, the hydrogen ions may be introduced into the doped substrate region from a second side of the doped substrate region. The second side of the doped substrate region may face a direction opposite to a direction which the first side of the doped substrate region faces.

According to an embodiment, the hydrogen ions may be introduced into the doped substrate region to a depth ranging from about 1 μm to about 500 μm from a second side of the doped substrate region. The second side of the doped substrate region may face a direction opposite to a direction which the first side of the doped substrate region faces.

According to an embodiment, the hydrogen ions may be implanted with a radiation energy ranging from about 100 keV to about 10 MeV.

According to an embodiment, the hydrogen ions may be implanted with an implantation dose ranging from about $10^{13}$ cm$^{-2}$ to about $10^{15}$ cm$^{-2}$.

According to an embodiment, introducing hydrogen ions into the doped substrate region to form a gettering region in the doped substrate region of the semiconductor carrier includes: introducing the hydrogen ions to create hydrogen-decorated intrinsic point defect complexes in the doped substrate region of the semiconductor carrier, the hydrogen-decorated intrinsic point defect complexes forming at least part of the gettering region.

According to an embodiment, introducing hydrogen ions into the doped substrate region to form a gettering region in the substrate region of the semiconductor carrier includes: implanting helium into the doped substrate region to create intrinsic point defect complexes in the substrate region of the semiconductor carrier, and in-diffusing hydrogen ions to decorate the intrinsic point defect complexes with hydrogen, the intrinsic point defect complexes decorated with hydrogen forming at least part of the gettering region. In-diffusing the hydrogen ions into the doped substrate region may be carried out prior to, and/or subsequent to implanting the helium into the doped substrate region.

According to an embodiment, the doped substrate region includes a highly doped region and an extremely highly doped region, each having a dopant carrier concentration higher than a doping concentration provided by the hydrogen-decorated intrinsic point defect complexes; and introducing hydrogen ions into the doped substrate region includes introducing the hydrogen ions into at least one of the highly doped region and the extremely high doped region. The extremely highly doped region may be proximate the second side of the doped substrate region. The highly doped region may be between the extremely highly doped region and the device region.

According to an embodiment, the highly doped region has a dopant carrier concentration of greater than or equal to about $10^{17}$ cm$^{-3}$ and the extremely highly doped region has a dopant carrier concentration of greater than or equal to about $10^{19}$ cm$^{-3}$ (e.g. greater than $4 \times 10^{19}$ cm$^{-3}$, according to an embodiment).

According to an embodiment, the method includes forming at least one of the highly doped region and the extremely highly doped region by implanting dopant atoms into the semiconductor carrier.

According to an embodiment, the method includes forming the extremely highly doped region by growing a highly doped epitaxial layer at a second side of the doped substrate region and enriching the highly doped epitaxial layer with dopant atoms during or after growth. The second side of the doped substrate region may face a direction opposite to a direction which the first side of the doped substrate region faces.

According to an embodiment, the method includes forming the device region by growing an epitaxial layer over the first side of the doped substrate region, the epitaxial layer having a lower doping concentration than the doped substrate region; and the method further includes forming the one or more electrical devices in the epitaxial layer having the lower doping concentration than the doped substrate region.

According to an embodiment, the method further includes forming a back side metallization layer over a second side of the doped substrate region, wherein the second side faces a direction opposite to a direction which the first side faces.

According to an embodiment, the method further includes thinning the doped substrate region from the second side of the substrate region before forming the back side metallization layer over the second side of the substrate region. Thinning the doped substrate region may be carried out before or after introducing the hydrogen ions into the doped substrate region.

According to an embodiment, the gettering region includes a plurality of gettering centers, wherein a maximum density of the gettering centers may be located at a depth in the doped substrate region that corresponds to greater than or equal to about 30% and less than 100% of a vertical extent of the doped substrate region, wherein the depth is measured from a second side of the doped substrate region.

Various embodiments provide a semiconductor chip arrangement, including: a semiconductor wafer substrate including a doped substrate region and a device region disposed over a first side of the doped substrate region; one or more electrical devices formed at least partially in the device region of the semiconductor carrier; a gettering region including hydrogen-decorated intrinsic point defect complexes formed in the doped substrate region of the semiconductor carrier; and a metal layer disposed over a second side of the doped substrate region. The second side of the doped substrate region may face a direction opposite to a direction which the first side of the doped substrate region faces.

According to an embodiment, the doped substrate region includes a highly doped region, wherein the gettering region is formed at least partially in the highly doped region, wherein the highly doped region has a doping concentration higher than a concentration of the hydrogen-decorated intrinsic point defect complexes.

According to an embodiment, the highly doped region has a doping concentration ten or more times higher (e.g. hundred or more times higher) than a concentration of the hydrogen-decorated intrinsic point defect complexes.

According to an embodiment, the highly doped region includes a dopant carrier concentration greater than about $10^{17}$ cm$^{-3}$.

According to an embodiment, the substrate region includes a highly doped region and an extremely highly doped region, and the gettering region is formed at least partially in at least one of the highly doped region and the extremely highly doped region. The extremely highly doped region may be proximate the second side of the doped substrate region. The highly doped region may be between the extremely highly doped region and the device region.

According to an embodiment, the highly doped region has a dopant carrier concentration of greater than or equal to about $10^{17}$ cm$^{-3}$ and the extremely highly doped region has a dopant carrier concentration of greater than or equal to about $10^{19}$ cm$^{-3}$ (e.g. greater than or equal to about $4\times10^{19}$ cm$^{-3}$, e.g. greater than or equal to about $10^{20}$ cm$^{-3}$).

According to an embodiment, a concentration of the hydrogen-decorated intrinsic point defect complexes is less than about $10^{17}$ cm$^{-3}$, for example less than or equal to about $5\times10^{16}$ cm$^{-3}$, e.g. less than or equal to about $10^{16}$ cm$^{-3}$.

According to an embodiment, the metal layer includes a back side metallization layer including at least one material from the following group of materials, the group of materials consisting of: copper, aluminum.

According to an embodiment, the gettering region includes a plurality of gettering centers, wherein a maximum density of the gettering centers may be located at a depth in the doped substrate region that corresponds to greater than or equal to about 30% and less than 100% of a vertical extent of the doped substrate region, for example at a depth that corresponds to greater than or equal to about 50% and less than 100% of the vertical extent of the doped substrate region, wherein the depth is measured from a second side of the doped substrate region.

Various embodiments provide a method for manufacturing a semiconductor device, the method including: providing a semiconductor wafer including a doped substrate region disposed between a front side and a back side of the semiconductor wafer, the semiconductor wafer further including one or more electrical devices formed at least partially at the front side of the semiconductor wafer; and subsequently introducing hydrogen ions into the doped substrate region from the back side of the semiconductor wafer to form a gettering region in the doped substrate region.

According to an embodiment, the method further includes forming a back side metallization layer over a back side of the doped substrate region.

According to an embodiment, introducing hydrogen ions into the substrate region from a back side of the semiconductor wafer to form a gettering region includes implanting protons into the doped substrate region from the back side of the semiconductor wafer to form hydrogen-decorated intrinsic point defect complexes in the doped substrate region of the semiconductor wafer.

According to an embodiment, the method further includes annealing the semiconductor wafer at a temperature ranging from about 350° C. to about 550° C. subsequent to introducing the hydrogen ions, to form the gettering region.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor chip arrangement comprising:
    a semiconductor carrier including:
        a doped substrate region, and
        a device region that is disposed over a first side of the doped substrate region;
    one or more electrical devices formed at least partially in the device region of the semiconductor carrier;
    a gettering region comprising hydrogen-decorated intrinsic point defect complexes formed in the doped substrate region of the semiconductor carrier; and
    a metal layer directly adhered to a second side of the doped substrate region, wherein the second side of the doped substrate region faces a direction opposite to a direction which the first side of the doped substrate region faces.

2. The semiconductor chip arrangement of claim 1, wherein the doped substrate region comprises a highly doped region and wherein the gettering region is formed at least partially in the highly doped region.

3. The semiconductor chip arrangement of claim 2, wherein the highly doped region has a dopant concentration higher than a concentration of the hydrogen-decorated intrinsic point defect complexes.

4. The semiconductor chip arrangement of claim 2, wherein the highly doped region has a dopant concentration ten or more times higher than a concentration of the hydrogen-decorated intrinsic point defect complexes.

5. The semiconductor chip arrangement of claim 2, wherein the highly doped region includes a dopant carrier concentration greater than about $10^{17}$ cm$^{-3}$.

6. The semiconductor chip arrangement of claim 1, wherein the substrate region comprises a highly doped region and an extremely highly doped region, and wherein the gettering region is formed at least partially in at least one of the highly doped region and the extremely highly doped region.

7. The semiconductor chip arrangement of claim 6, wherein the extremely highly doped region is proximate to the second side of the doped substrate region.

8. The semiconductor chip arrangement of claim 6, wherein the highly doped region is between the extremely highly doped region and the device region.

9. The semiconductor chip arrangement of claim 6, wherein the highly doped region has a dopant carrier concentration of greater than or equal to about $10^{17}$ cm$^{-3}$ and the extremely highly doped region has a dopant carrier concentration of greater than or equal to about $10^{19}$ cm$^{-3}$.

10. The semiconductor chip arrangement of claim 7, the extremely highly doped region has a dopant carrier concentration of greater than or equal to about $4 \times 10^{19}$ cm$^{-3}$.

11. The semiconductor chip arrangement of claim 7, the extremely highly doped region has a dopant carrier concentration of greater than or equal to about $10^{20}$ cm$^{-3}$.

12. The semiconductor chip arrangement of claim 1, wherein a concentration of the hydrogen-decorated intrinsic point defect complexes is less than about $10^{17}$ cm$^{-3}$.

13. The semiconductor chip arrangement of claim 1, wherein a concentration of the hydrogen-decorated intrinsic point defect complexes is less than about or equal to about $5 \times 10^{16}$ cm$^{-3}$.

14. The semiconductor chip arrangement of claim 1, wherein the metal layer includes a back side metallization layer including at least one of copper or aluminum.

15. The semiconductor chip arrangement of claim 1, the gettering region comprises a plurality of gettering centers, wherein a maximum density of the gettering centers is located at a depth in the doped substrate region that corresponds to greater than or equal to about 30% and less than 100% of a vertical extent of the doped substrate region, wherein the depth is measured from a second side of the doped substrate region.

16. The semiconductor chip arrangement of claim 15, the depth corresponds to greater than or equal to about 50% and less than 100% of the vertical extent of the doped substrate region.

17. The semiconductor chip arrangement of claim 1, wherein the metal layer is directly adhered to the second side of the doped substrate region by a die attach material.

* * * * *